US012795984B2

(12) United States Patent
He et al.

(10) Patent No.: US 12,795,984 B2
(45) Date of Patent: Nov. 10, 2026

(54) 3D STACKED FIELD-EFFECT TRANSISTOR DEVICE WITH PN JUNCTION STRUCTURE

(71) Applicant: SAMSUNG ELECTRONICS CO., LTD., Suwon-si (KR)

(72) Inventors: Ming He, San Jose, CA (US); Mehdi Saremi, Danville, CA (US); Rebecca Park, Mountain View, CA (US); Muhammed Ahosan Ul Karim, San Jose, CA (US); Harsono Simka, Saratoga, CA (US); Sungil Park, Hwaseong-si (KR); Myungil Kang, Hwaseong-si (KR); Kyungho Kim, Hwaseong-si (KR); Doyoung Choi, Hwaseong-si (KR); JaeHyun Park, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 737 days.

(21) Appl. No.: 17/984,025

(22) Filed: Nov. 9, 2022

(65) Prior Publication Data

US 2024/0047539 A1 Feb. 8, 2024

Related U.S. Application Data

(60) Provisional application No. 63/395,604, filed on Aug. 5, 2022.

(51) Int. Cl.
*H10D 30/62* (2025.01)
*H10D 30/01* (2025.01)
(Continued)

(52) U.S. Cl.
CPC ..... *H10D 30/6219* (2025.01); *H10D 30/0243* (2025.01); *H10D 30/831* (2025.01); *H10D 62/343* (2025.01); *H10D 62/8503* (2025.01)

(58) Field of Classification Search
None
See application file for complete search history.

(56) References Cited

U.S. PATENT DOCUMENTS

| | | | |
|---|---|---|---|
| 8,410,549 | B2 | 4/2013 | Bulucea et al. |
| 9,842,932 | B1 | 12/2017 | Chen et al. |

(Continued)

FOREIGN PATENT DOCUMENTS

| | | | |
|---|---|---|---|
| CN | 113257815 | A | 8/2021 |
| EP | 4 156 269 | A1 | 3/2023 |

(Continued)

OTHER PUBLICATIONS

Communication dated Jan. 9, 2024, issued by the European Patent Office in counterpart European Application No. 23177564.4.

(Continued)

*Primary Examiner* — Steven B Gauthier
*Assistant Examiner* — Lamont B Koo
(74) *Attorney, Agent, or Firm* — Myers Bigel, P.A.

(57) ABSTRACT

Provided is a three-dimensionally stacked field-effect transistor (3DSFET) device which includes: a lower source/drain region of a 1$^{st}$ polarity type connected to a lower channel structure; an upper source/drain region of a 2$^{nd}$ polarity type, connected to an upper channel structure, above the lower source/drain region; and a PN junction structure, between the lower source/drain region and the upper source/drain region, configured to electrically isolate the upper source/drain region from the lower source/drain region, wherein the PN junction structure includes a 1$^{st}$ region of the 1$^{st}$ polarity type and a 2$^{nd}$ region of the 2$^{nd}$ polarity type.

20 Claims, 8 Drawing Sheets

(51) Int. Cl.

| | |
|---|---|
| ***H10D 30/83*** | (2025.01) |
| ***H10D 62/17*** | (2025.01) |
| ***H10D 62/85*** | (2025.01) |

(56) References Cited

U.S. PATENT DOCUMENTS

| | | | |
|---|---|---|---|
| 10,840,146 | B1 | 11/2020 | Paul et al. |
| 11,101,374 | B1 | 8/2021 | Reznicek et al. |
| 11,335,807 | B2 | 5/2022 | Mehandru et al. |
| 2018/0108577 | A1 | 4/2018 | Zhu et al. |
| 2020/0258881 | A1 | 8/2020 | Lilak et al. |
| 2020/0411691 | A1 | 12/2020 | Jambunathan et al. |
| 2022/0085013 | A1 | 3/2022 | Reznicek et al. |
| 2022/0352310 | A1 | 11/2022 | Zhu |

FOREIGN PATENT DOCUMENTS

| | | | |
|---|---|---|---|
| TW | 201044591 | A1 | 12/2010 |
| WO | 2018/125082 | A1 | 7/2018 |

OTHER PUBLICATIONS

Office Action issued on Jul. 7, 2025 by the Taiwanese Patent Office in corresponding TW Patent Application No. 112120791.

4000

3D STACKED FIELD-EFFECT TRANSISTOR DEVICE WITH PN JUNCTION STRUCTURE

CROSS-REFERENCE TO RELATED APPLICATION

This application is based on and claims priority from U.S. Provisional Application No. 63/395,604 filed on Aug. 5, 2022 in the U.S. Patent and Trademark Office, the disclosures of which is incorporated herein in its entirety by reference.

BACKGROUND

1. Field

Apparatuses and methods according to embodiments relate to a standard cell architecture of a three-dimensionally (3D) stacked field-effect transistor device including a PN junction structure electrically isolating a lower source/drain region and an upper source/drain region from each other.

2. Description of the Related Art

Growing demand for integrated circuits having high device density as well as high performance has introduced a 3D stacked field-effect transistor (3DSFET) device in which two or more field-effect transistors such as fin field-effect transistor (FinFET) and nanosheet transistor are vertically stacked. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure and a gate structure surrounding all four surfaces of each of the nanosheet channel layers. The nanosheet transistor is referred to as gate-all-around (GAA) transistor, multi-bridge channel field-effect transistor (MBCFET).

However, the 3DSFET device is also known to be difficult to manufacture due to the high device density requiring high aspect-ratio patterning and isolation.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a 3DSFET device in which a PN junction structure is formed to electrical isolate a lower source/drain region and an upper source/drain region, according to embodiments.

According to an embodiment, there is provided a 3DSFET device which may include: a lower source/drain region of a $1^{st}$ polarity type connected to a lower channel structure; an upper source/drain region of a $2^{nd}$ polarity type, connected to an upper channel structure, above the lower source/drain region; and a PN junction structure, between the lower source/drain region and the upper source/drain region, configured to electrically isolate the upper source/drain region from the lower source/drain region, wherein the PN junction structure includes a $1^{st}$ region of the $1^{st}$ polarity type and a $2^{nd}$ region of the $2^{nd}$ polarity type.

According to an embodiment, there is provided a method of manufacturing a 3DSFET device. The method may include: (a) providing an intermediate 3DSFET structure including a lower channel structure and an upper channel structure above the lower channel structure; (b) growing a lower epitaxial structure (Epi) of a $1^{st}$ polarity type based on the lower channel structure; (c) growing a $1^{st}$ semiconductor layer of a $2^{nd}$ polarity type, opposite to the $1^{st}$ polarity type, on the lower Epi based on the lower Epi; (d) growing a $2^{nd}$ semiconductor layer of the $1^{st}$ polarity type on the $1^{st}$ semiconductor layer based on the $1^{st}$ semiconductor layer; and (e) growing an upper Epi of the $2^{nd}$ polarity type on the $2^{nd}$ semiconductor layer based on the upper channel structure and the $2^{nd}$ semiconductor layer According to an embodiment, there is provided a method of manufacturing a 3DSFET device. The method may include: (a) providing an intermediate 3DSFET structure including a substrate, a lower channel structure above the substrate, and an upper channel structure above the lower channel structure; (b) growing an upper epitaxial structure (Epi) of a $1^{st}$ polarity type based on the upper channel structure; (c) growing a $1^{st}$ semiconductor layer of a $2^{nd}$ polarity type, opposite to the $1^{st}$ polarity type, on the upper Epi based on the lower Epi; (d) growing a $2^{nd}$ semiconductor layer of the $1^{st}$ polarity type on the $1^{st}$ semiconductor layer based on the $1^{st}$ semiconductor layer; and (e) growing a lower Epi of the $2^{nd}$ polarity type based on the substrate, the lower channel structure and the $2^{nd}$ semiconductor layer.

BRIEF DESCRIPTION OF DRAWINGS

Example embodiments of the inventive concept will be more clearly understood from the following detailed description taken in conjunction with the accompanying drawings in which.

DETAILED DESCRIPTION OF EXAMPLE EMBODIMENTS

Figure 1:
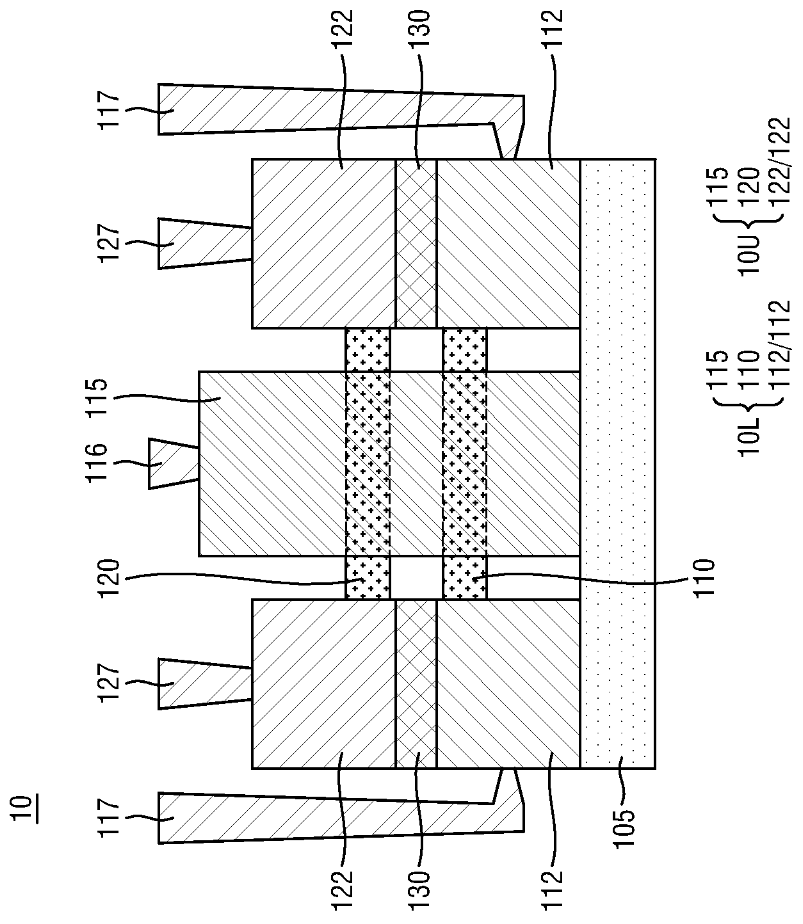
FIG. 1 illustrates a simplified structure of a 3DSFET device including a lower field-effect transistor and an upper field-effect transistor with a dielectric layer therebetween, according to an embodiment.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers and sacrificial layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be understood that, although the terms $1^{st}$, $2^{nd}$, $3^{rd}$, $4^{th}$, etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices such as a FinFET and a nanosheet transistor may or may not be described in detail herein. For example, a certain isolation layer or structure of a semiconductor device may be omitted herein when this layer or structure is not related to the various of aspects of the embodiments.

FIG. 1 illustrates a simplified structure of a 3DSFET device including a lower field-effect transistor and an upper field-effect transistor with a dielectric layer therebetween, according to an embodiment.

FIG. 1 shows a cross-section view of a 3DSFET device 10 in a channel-length direction, which is perpendicular to a channel-width direction.

Referring to FIG. 1, the 3DSFET device 10 may include a lower field-effect transistor 10L formed on a substrate 105, and an upper field-effect transistor 10U formed above the lower field-effect transistor 10L. The substrate 105 may be a silicon (Si) substrate although it may include other materials such as silicon germanium (SiGe), silicon carbide (SiC), not being limited thereto. The lower field-effect transistor 10L may include lower source/drain regions 112 and a lower channel structure 110 connecting the lower source/drain regions 112 to each other, and the upper field-effect transistor 10U may include upper source/drain regions 122 and an upper channel structure 120 connecting the upper source/drain regions 122 to each other. According to embodiments, each of the channel structures 110 and 120 may be formed of a plurality of nanosheet channel layers to form a nanosheet transistor, or one or more fin structures to form a FinFET. Thus, each of the lower field-effect transistor 10L and the upper field-effect transistor 10U may be either a nanosheet transistor or a FinFET, or one of the lower field-effect transistor 10L and the upper field-effect transistor 10U may be a FinFET while the other may be a nanosheet transistor, according to embodiments.

The channel structures 110 and 120 may include Si or SiGe that may have been epitaxially grown based on the substrate 105. The source/drain regions 112 and 122 may also include Si or SiGe that may have been epitaxially grown based on the substrate 105 and/or the channel structures 110 and 120.

Further, the lower field-effect transistor 10L and the upper field-effect transistor 10U may include a gate structure 115 surrounding the lower channel structure 110 and the upper channel structure 120. Although FIG. 1 shows that the gate structure 115 is shared by the two field-effect transistors 10L and 10U to receive a same gate input signal, it may be divided into a lower gate structure and an upper gate structure isolated from each other depending on a type of the 3DSFET device 10. The gate structure 115 may include titanium (Ti), tantalum (Ta), tungsten (W), ruthenium (Ru), molybdenum (Mo), cobalt (Co), aluminum (Al), copper (Cu), and/or their compound. A gate contact plug 116 may be formed on the gate structure 115 to receive a gate input signal.

The lower field-effect transistor 10L may be a p-type metal-oxide-semiconductor field-effect transistor (PFET) in which the lower source/drain regions 112 are doped with p-type dopants such as boron (B) or gallium (Ga), and the upper field-effect transistor 10U may be an n-type field-effect transistor (NFET) in which the upper source/drain regions 122 are doped with n-type dopants such as phosphorus (P), arsenic (As) or antimony (Sb). However, the lower field-effect transistor 10L may be the NFET, and the upper field-effect transistor 10U may be the PFET, according to an embodiment.

In the meantime, the 3DSFET device 10 may also include a dielectric layer 130 formed of silicon oxide (e.g., SiO) or silicon nitride (e.g., SiN) to electrically isolate the lower source/drain region 112 from the upper source/drain region 122 vertically above the lower source/drain region 112. This isolation of the two source/drain regions 112 and 122 may be necessary, for example, when one of the lower source/drain regions 112 and one of the upper source/drain regions 122 thereabove are connected to a positive voltage source and a negative voltage source through a lower source/drain contact plug 117 and an upper source/drain contact plug 127, respectively. Further, the dielectric layer 130 may also be necessary, for example, when the other lower source/drain region 112 and the other upper source/drain region 122 thereabove are connected to different output nodes Q1 and Q2 through another lower source/drain contact plug 117 and another upper source/drain contact plug 127, respectively.

To form the source/drain regions 112 and 122 of the 3DSFET device 10, a lower epitaxial structure (Epi) for the lower source/drain region 112 may be grown first from the substrate 105 and/or the lower channel structure 110, the dielectric layer 130 for the electrical isolation may be formed thereon, and may be etched back to provide a space for growing an upper Epi for the upper source/drain region 122, and then, the upper Epi may be grown in the etched-back space from the upper channel structure 120.

However, the formation of the dielectric layer 130 including the etch-back operation applied to the dielectric layer 130 may expose various challenges in manufacturing the 3DSFET device 10. For example, if the dielectric layer 130 is etched back too deep, the lower source/drain region 112 may form a short circuit with the upper source/drain region 122. On the other hand, if the dielectric layer 130 is etched back insufficiently, it may prevent the upper Epi from properly being grown in the etched-back space to form the upper source/drain region.

Figure 2:
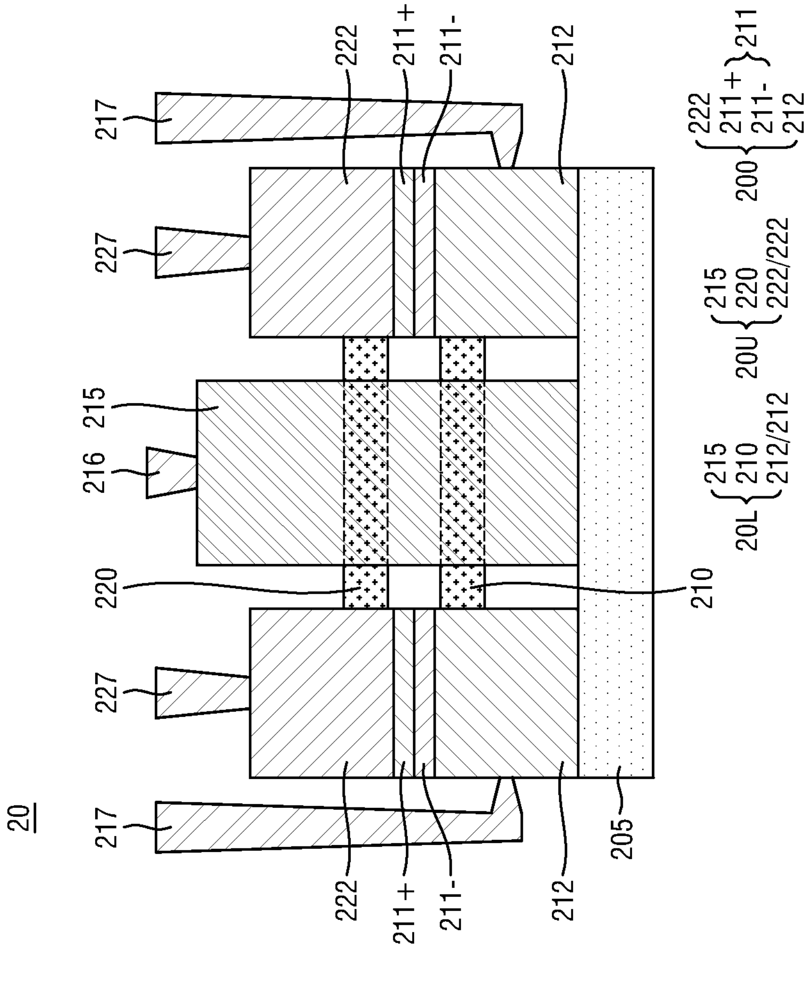
FIG. 2 illustrate a simplified structure of a 3DSFET including a lower field-effect transistor and an upper field-effect transistor with a PN junction structure therebetween, according to an embodiment.

FIG. 2 illustrate a simplified structure of a 3DSFET including a lower field-effect transistor and an upper field-effect transistor with a PN junction structure therebetween, according to an embodiment.

Referring to FIG. 2, a 3DSFET device 20 may include a lower field-effect transistor 20L formed on a substrate 205, and an upper field-effect transistor 20U formed above the lower field-effect transistor 20L, similar to the 3DSFET device 10 shown in FIG. 1. The lower field-effect transistor 20L may include a lower channel structure 210 connecting lower source/drain regions 212 to each other, and the upper field-effect transistor 20U may include an upper channel structure 220 connecting upper source/drain regions 222 to each other. A gate structure 215 shared by the two field-effect transistors 20L and 20U may surround the channel structures 210 and 220. A plurality of contact plugs 216, 217 and 227 may also be included in the 3DSFET device 20. These structural elements are the same as or similar to those corresponding structural elements of the 3DSFET device 10, and thus, duplicate descriptions about the same or corresponding structural elements are omitted, and only different aspects of the 3DSFET device 20 are described herebelow.

According to an embodiment, the 3DSFET device 20 may include a PN junction structure 211 in place of the dielectric layer 130 between the lower source/drain region 112 and the upper source/drain region 122 in FIG. 1.

According to an embodiment, the PN junction structure 211 may be formed between the lower source/drain region 212 of p-type and the upper source/drain region 222 of n-type. The PN junction structure 211 may include a $1^{st}$ semiconductor layer and a $2^{nd}$ semiconductor layer each of which may be formed of Si, not being limited thereto. Further, the $1^{st}$ semiconductor layer may include n-type dopants similar to those included in the n-type upper source/drain region 222, and the $2^{nd}$ semiconductor layer may include p-type dopants similar to those included in the p-type lower source/drain region 212. Thus, the $1^{st}$ semiconductor layer may form an n-type region 211− of the PN junction structure 211, and the $2^{nd}$ semiconductor layer may form a p-type region 211+ of the PN junction structure 211.

According to an embodiment, the PN junction structure 211 including the n-type region 211− and the p-type region 211+ may be formed between the lower source/drain region 212 of p-type and the upper source/drain region 222 of n-type in a reverse-biased form. For example, the n-type region 211− may be formed on a top surface the lower source/drain region 212 of p-type, and the p-type region 211+ above the n-type region 211− may be formed on a bottom surface of the upper source/drain region 122 of n-type. Thus, each of the two opposite sides with respect to the gate structure 215 in the 3DSFET device 20 may include a PNPN structure 200 which is a stack of the p-type lower source/drain region 212, the n-type region 211− and the p-type region 211+ of the PN junction structure 211, which is in the reverse-biased form, and the n-type upper source/drain region 222 in this order above the substrate 205.

The PN junction structure 211 in the reversed-bias form may electrically isolate the lower source/drain region 212 from the upper source/drain region 222. For example, when the p-type lower source/drain region 212 and the n-type upper source/drain region 222 are respectively connected to the positive voltage source and the negative voltage source, the PN junction structure 211 may enter in a reverse-biased condition to prevent or minimize current flow between the lower source/drain region 212 and the upper source/drain region 222. In other words, the reverse-biased PN junction structure 211 may function as an electrical isolation structure between the lower source/drain region 212 and the upper source/drain region 222.

Although the 3DSFET device 20 shown in FIG. 2 may be formed of the PNPN structure 200 at each side of the gate structure 115 surrounding the channel structures 110 and 120, the PNPN structure 200 may be formed at only one side of the gate structure 115 in a 3DSFET device, according to an embodiment. Further, the 3DSFET device 20 may be formed of an NPNP structure in which an n-type lower source/drain region, a p-type region of a PN junction structure thereon, an n-type region of the PN junction structure, and a p-type upper source/drain region are stacked in this order, according to an embodiment. In this case, the 3DSFET device 20 may be formed of an NFET at a lower stack, and a PFET at an upper stack, and the PN junction structure may also function as an isolation structure between the n-type lower source/drain region and the p-type upper source/drain region.

Here below, a method of forming a PNPN structure for a 3DSFET device such as the PNPN structure 200 in the 3DSFET device 20 is described.

Figure 3B:
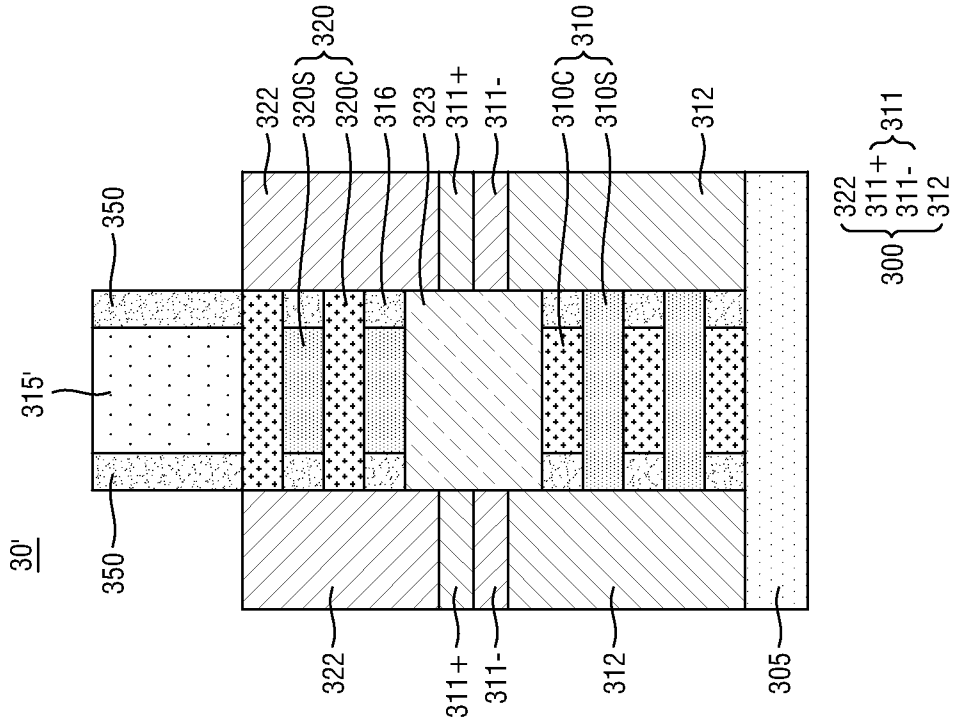
FIGS. 3A and 3B illustrate a post-simulation diagram showing formation of a PNPN structure based on a substrate and a channel structure in an intermediate 3DSFET structure, according to an embodiment.
Figure 3A:
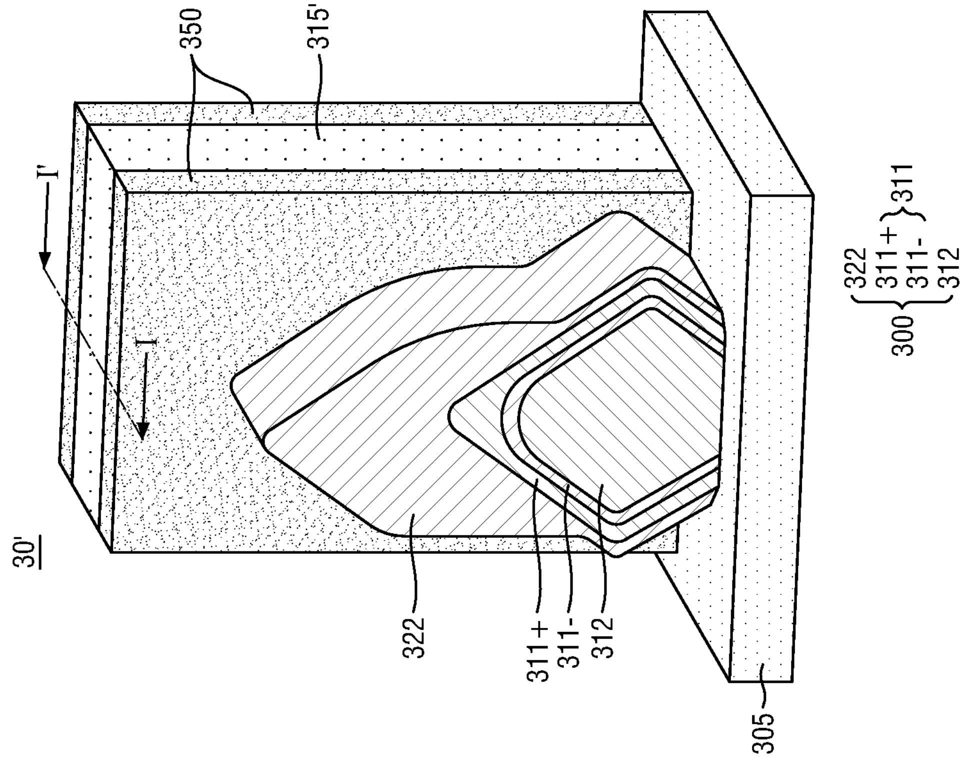
Figure 4:
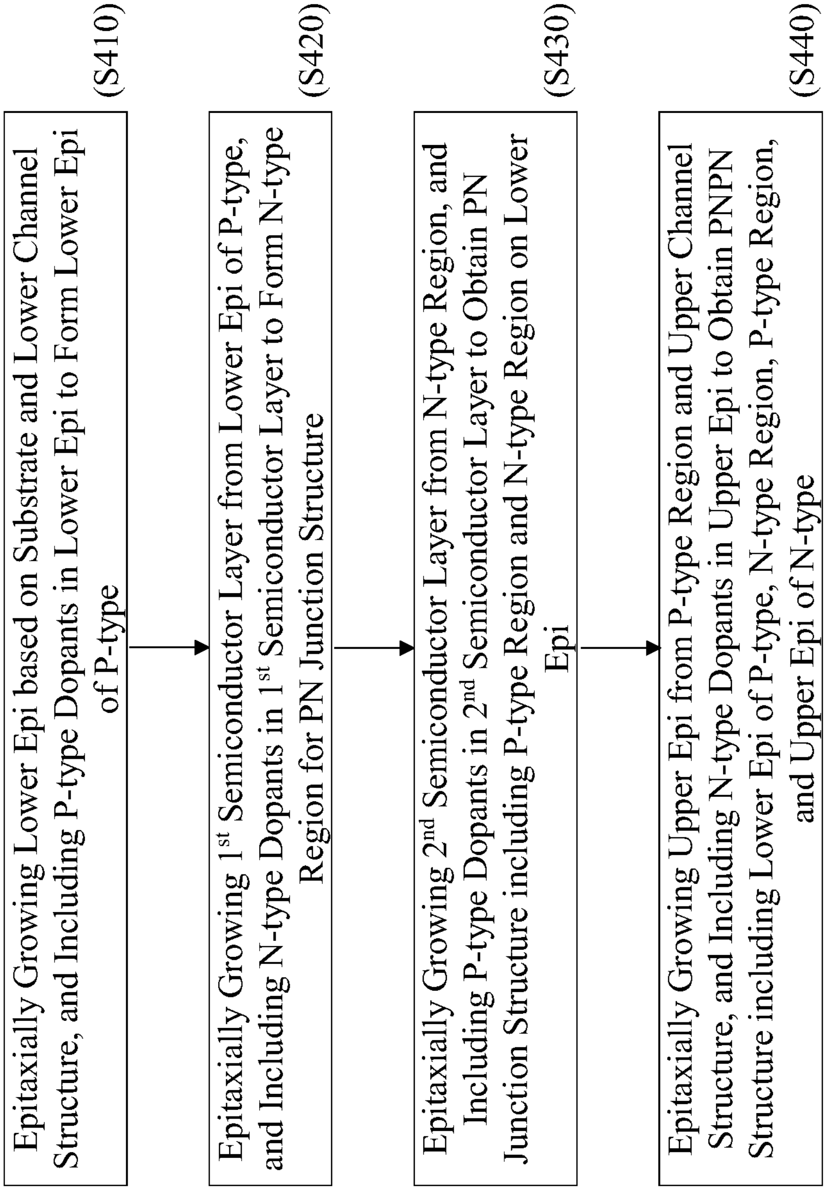
FIG. 4 illustrates a flowchart of a method of forming the PNPN structure shown in FIGS. 3A and 3B, according to an embodiment.

FIGS. 3A and 3B illustrate a post-simulation diagram showing formation of a PNPN structure based on a substrate and a channel structure in an intermediate 3DSFET structure, according to an embodiment. FIG. 4 illustrates a flowchart of a method of forming the PNPN structure shown in FIGS. 3A and 3B, according to an embodiment.

FIG. 3A is a perspective view, including a channel-width direction view and a channel-length direction view, of an intermediate 3DSFET structure 30' including a PNPN structure 300 before the intermediate 3DSFET structure 30' is finished as a 3DSFET device corresponding to the 3DSFET device 20 shown in FIG. 2, and FIG. 3B is a cross-section view of the intermediate 3DSFET structure 30' in a channel-length direction vertically taken down along a line I-I' shown in FIG. 3A.

Referring to FIGS. 3A and 3B, the intermediate 3DSFET structure 30' may include a plurality of structural elements which are the same as or similar to those included in the 3DSFET device 20 shown in FIG. 2. Thus, duplicate descriptions thereof may be omitted herein, as necessary.

The intermediate 3DSFET structure 30' may include a lower channel structure 310 for a lower nanosheet transistor on a substrate 305, and an upper channel structure 320 for an upper nanosheet transistor. The lower channel structure 310 may include a plurality of lower nanosheet channel layers 310C and lower sacrificial layers 310S alternatingly stacked on the substrate 305, and the upper channel structure 320 may include a plurality of upper nanosheet channel layers 320C and upper sacrificial nanosheet layers 320S alternatingly stacked on the lower channel structure 310. These semiconductor nanosheet layers of the channel structures 310 and 320 may be epitaxially grown based on the substrate 305. The nanosheet channel layers 310C and 320C may be formed of Si, and the sacrificial layers 310S an 320S may be formed of SiGe, for example.

An isolation layer 323 may be formed between the lower channel structure and the upper channel structure 320. The isolation layer 323 may also be epitaxially grown based on the substrate 305 along with the channel structures 310 and 320, and may be formed of silicon nitride. According to an embodiment, the isolation layer 323 may be formed of SiGe having germanium concentration different from that of the sacrificial layers 310S and 320S.

Although the channel structures 310 and 320 shown in FIGS. 3A and 3B include nanosheet layers as channel layers, at least one of the channel structures 310 and 320 may alternatively include one or more fin structures as channel layers to form a FinFET(s) in a 3DSFET device to be obtained from the intermediate 3DSFET structure 30', as described in reference to FIGS. 1 and 2.

A dummy gate structure 315' may be formed to surround the channel structures 310 and 320. This dummy gate structure 315' will be removed along with the sacrificial layers 310S and 320S to be replaced by a replacement gate structure, corresponding to the gate structure 215 shown in FIG. 2, in a later step of manufacturing the 3DSFET device. The dummy gate structure 315' may be formed of amorphous silicon (a-Si), not being limited thereto. A gate spacer 350 may be formed on side surfaces of the dummy gate structure 315'. The gate spacer 350 may include a material such as silicon nitride, silicon carobonitride or silicon oxycarbonitride, not being limited thereto.

Lower epitaxial structures (Epis) 312 may be respectively formed on both ends of the lower channel structure 310. The lower Epis 312 may be connected to each other through the lower nanosheet channel layers 310C while they may be isolated from the lower sacrificial layers 310S by inner spacers 316. Similarly, upper Epis 322 may be respectively formed on both ends of the upper channel structure 320. The upper Epis 322 may be connected to each other through the upper nanosheet channel layers 320C while they may be isolated from the lower sacrificial layers 310S by the inner spacers 316. The inner spacers 316 may be formed of silicon nitride, for example. The lower Epis 312 and the upper Epis 322 will form lower source/drain regions for the lower nanosheet transistor and upper source/drain regions for the upper nanosheet transistor in the 3DSFET device to be finished from the intermediate 3DSFET structure 30'.

The lower Epis 312 may be formed of a material(s) similar to that forming the substrate 305 and/or the lower nanosheet channel layers 310C. For example, the material(s) forming the lower Epi 312 may include SiGe. The lower Epi 312 may further include p-type dopants such as boron (B), gallium (Ga), etc. to form the lower nanosheet transistor including the lower Epi 312 as PFET in the 3DSFET device. The upper Epi 322 may also be formed of a material(s) similar to that forming the substrate 305 and/or the upper nanosheet channel layers 320C. For example, the material(s) forming the upper Epi 322 may include Si. The upper Epis 322 may further include n-type dopants such as phosphorus (P), arsenic (As), antimony (Sb), etc. to form the upper nanosheet transistor including the upper Epi 322 as NFET in the 3DSFET device.

A lower Epi 312 may be isolated from an upper Epi 322 formed thereabove by a PN junction structure 311 including a $1^{st}$ semiconductor layer and a $2^{nd}$ semiconductor layer each of which may be formed of Si, not being limited thereto. The $1^{st}$ semiconductor layer may further include n-type dopants similar to those included in the upper Epi 322 of n-type, and the $2^{nd}$ semiconductor layer may further include p-type dopants similar to those included in the lower Epi 312 of p-type. Thus, the $1^{st}$ semiconductor layer may form an n-type region 311− of the PN junction structure 311, and the $2^{nd}$ semiconductor layer may form a p-type region 311+ of the PN junction structure 311.

According to embodiments, the upper Epi 322 of n-type and the n-type region 311− may include the same or different n-type dopants, and the lower Epi 312 and the p-type region 311+ may include the same or different p-type dopants.

As in the 3DSFET device 20 shown in FIG. 2, the PN junction structure 311 of the intermediate 3DSFET structure 30' may also take a reverse-biased form between the lower Epi 312 of p-type and the upper Epi 322 of n-type. For example, the n-type region 311− may be formed on a top surface of the lower Epi 312 of p-type, and the p-type region 311+ above the n-type region 311− may be formed on a bottom surface of the upper Epi 322 of n-type.

As the lower Epi 312 of p-type, the n-type region 311−, the p-type region 311+, and the upper Epi 322 of n-type are formed in the above manner, the intermediate 3DSFET structure 30' may include a PNPN structure 300 at at least one side of the dummy gate structure 315'.

Herebelow, a method of forming the PNPN structure 300 according to an embodiment may be described in reference to FIG. 4.

In operation S410, the lower Epi 312 may be epitaxially grown based on the substrate 305 and the lower channel structure 310 including the lower nanosheet channel layers 310C. When the lower Epi 312 is grown, p-type dopants may be doped, implanted or diffused in the lower Epi 312 to form the lower Epi 312 of p-type.

According to an embodiment, when the lower Epi 312 is grown, an upper region of the intermediate 3DSFET structure 30' including a lateral side of the upper channel structure 320 in the channel-length direction view may be sealed by a protection layer such as spin-on-glass (SOG) not being limited thereto so that the upper Epi 322 may not be grown along with the lower Epi 312.

In operation S420, the 1$^{st}$ semiconductor layer including Si, for example, may be epitaxially grown from at least the lower Epi 312 of p-type, and n-type dopants may be doped, implanted or diffused in the 1$^{st}$ semiconductor layer. Thus, the n-type region 311− for a PN junction structure may be formed.

Here, the 1$^{st}$ semiconductor layer may be outwardly grown in all directions from the lower Epi 312 except a vertical downward direction in a channel-width direction view as shown in FIG. 3A, and thus, an outer surface of the lower Epi 312 including top and side surfaces except a bottom surface thereof on the substrate 305 may be surrounded by the n-type region 311− for the PN junction structure.

In operation S430, the 2$^{nd}$ semiconductor layer including Si, for example, may be epitaxially grown from at least the n-type region 311−, and p-type dopants may be doped, implanted or diffused in the 2$^{nd}$ semiconductor layer. Thus, the p-type region 311+ may be formed to obtain the PN junction structure 311 including the p-type region 311+ and the n-type region 311− on the lower Epi 312 of p-type.

Here, the 2$^{nd}$ semiconductor layer for the p-type region 311+ may be grown to surround the n-type region 311−, but may not be grown on the bottom surface of the lower Epi 312, in the channel-width direction view as shown in FIG. 3A.

In operation S440, the upper Epi 322 may be epitaxially grown from the p-type region 311+ in addition to the upper channel structure 320 including the upper nanosheet channel layers 320C. When the upper Epi 322 is grown, n-type dopants may be doped, implanted or diffused in the upper Epi 322 to obtain the PNPN structure 300 including the lower Epi 312 of p-type, the n-type region 311−, the p-type region 311+, and the upper Epi 322 of n-type.

According to an embodiment, prior to the upper Epi 322 growth, the sealed upper region of the intermediate 3DSFET structure 30' may be opened by removing the protection layer through, for example, dry and/or wet etching.

Here, the upper Epi 322 may be grown to surround the p-type region 311+ of the PN junction structure 311, but may not be grown on the bottom surface of the lower Epi 312, in the channel-width direction view as shown in FIG. 3A. Thus, in the cross-section view of the intermediate 3DSFET structure 30' shown in FIG. 3B, the PN junction structure 311 may be interposed between the lower Epi 312 of p-type and the upper Epi 322 of n-type.

Although not shown in the drawings for brevity purposes, additional structural elements may be added to the intermediate 3DSFET structure 30' through patterning, etching and/or deposition processes to complete the intermediate 3DSFET structure 30' as a 3DSFET device. For example, the dummy gate structure 315' and the sacrificial layers 310S and 320S may be replaced by a replacement gate structure corresponding to the gate structure 115, and a plurality of contact plugs may be formed on the intermediate 3DSFET structure 30' to obtain the 3DSFET device corresponding to the 3DSFET device 20 shown in FIG. 2.

As described above in reference to FIGS. 3A and 3B, the PN junction structure 311 including the p-type region 311+ and the n-type region 311− in a reverse-biased form may function as an electrical isolation structure between the lower source/drain region (lower Epi 312) and the upper source/drain region (upper Epi 322). Thus, the method of manufacturing a 3DSFET device based on the intermediate 3DSFET structure 30' may dispense with the complicated and difficult process of forming a dielectric layer between a lower Epi and an upper Epi.

In the above embodiments, a PN junction structure in a reverse-biased form may be formed as an electrical isolation structure between a lower Epi and an upper Epi, and thus, at least one of two opposite sides with respect to a gate structure in the 3DSFET device may form lower and upper source/drain regions in a form of a PNPN structure. However, the disclosure is not limited thereto. In a following embodiment, a reverse-biased PN junction structure along with a lower Epi and an upper Epi may form lower and upper source/drain regions in a form of a P(NPN) structure.

Figure 5A:
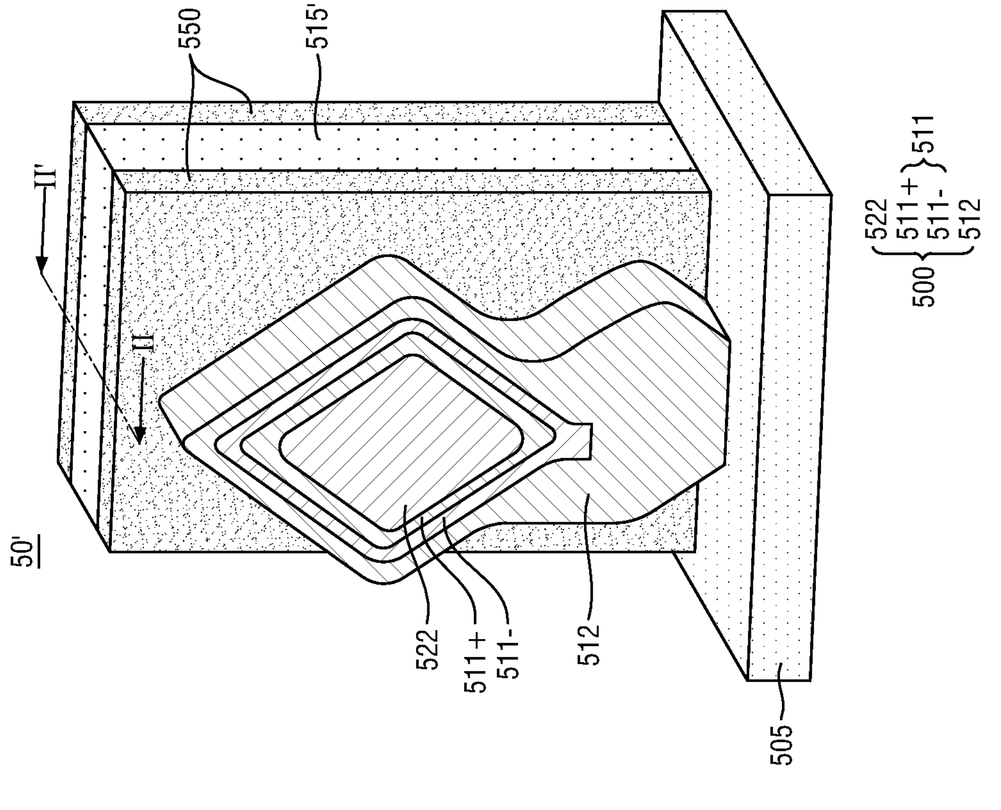
FIGS. 5A and 5B illustrate a post-simulation diagram showing formation of a P(NPN) structure based on a substrate and a channel structure in an intermediate 3DSFET structure, according to an embodiment.
Figure 5B:
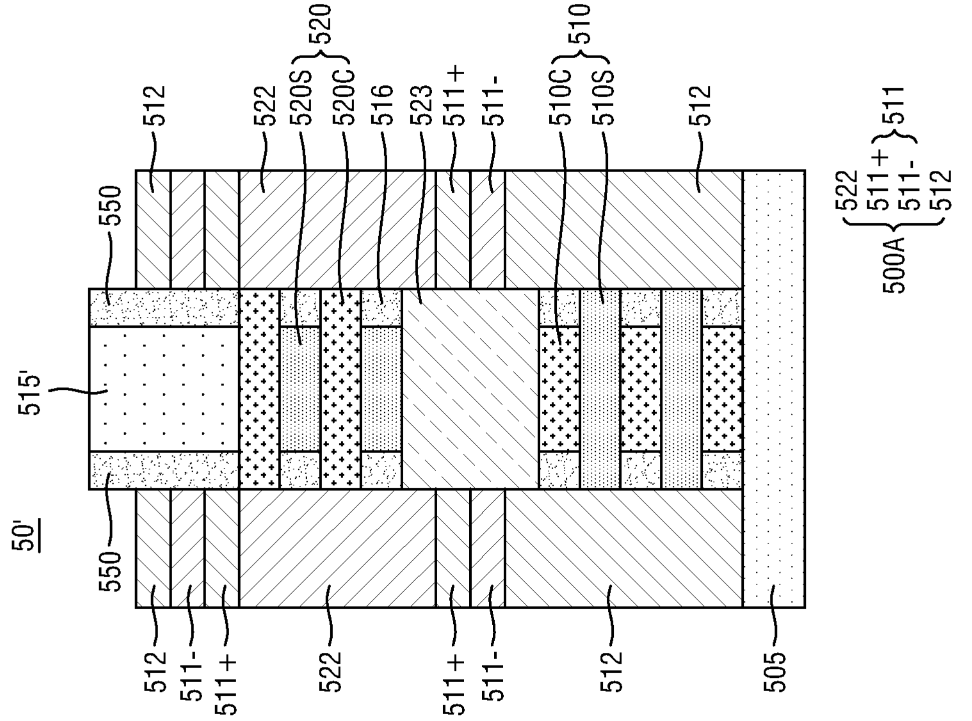
Figure 5C:
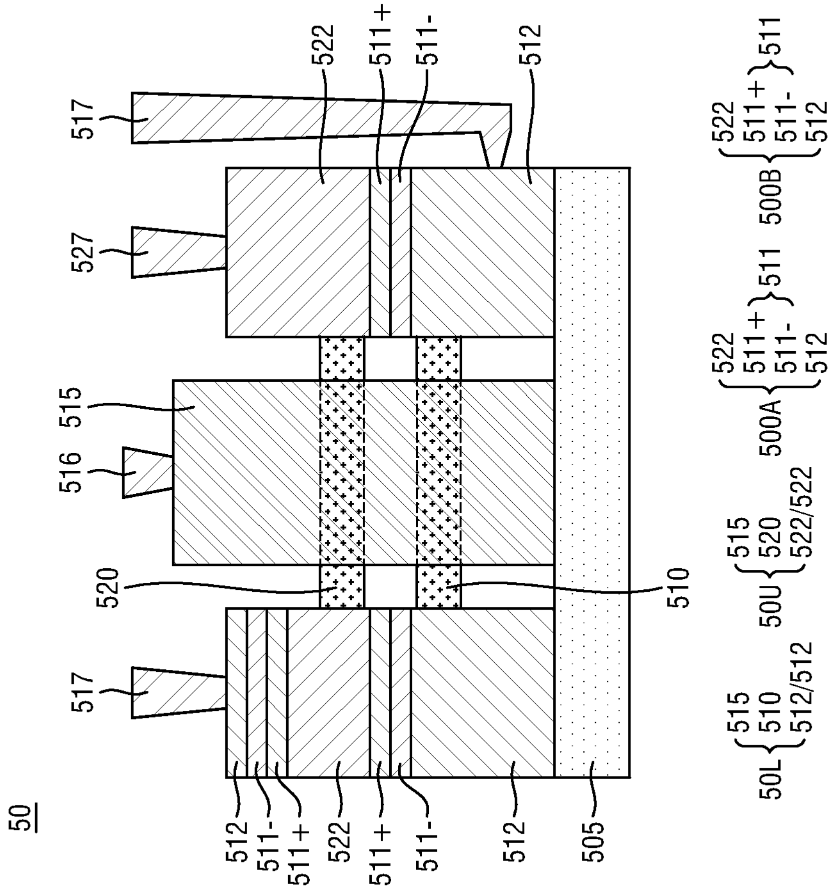
FIG. 5C illustrates a simplified structure of a 3DSFET device including the P(NPN) structure shown in FIGS. 5A and 5B, according to an embodiment.
Figure 6:
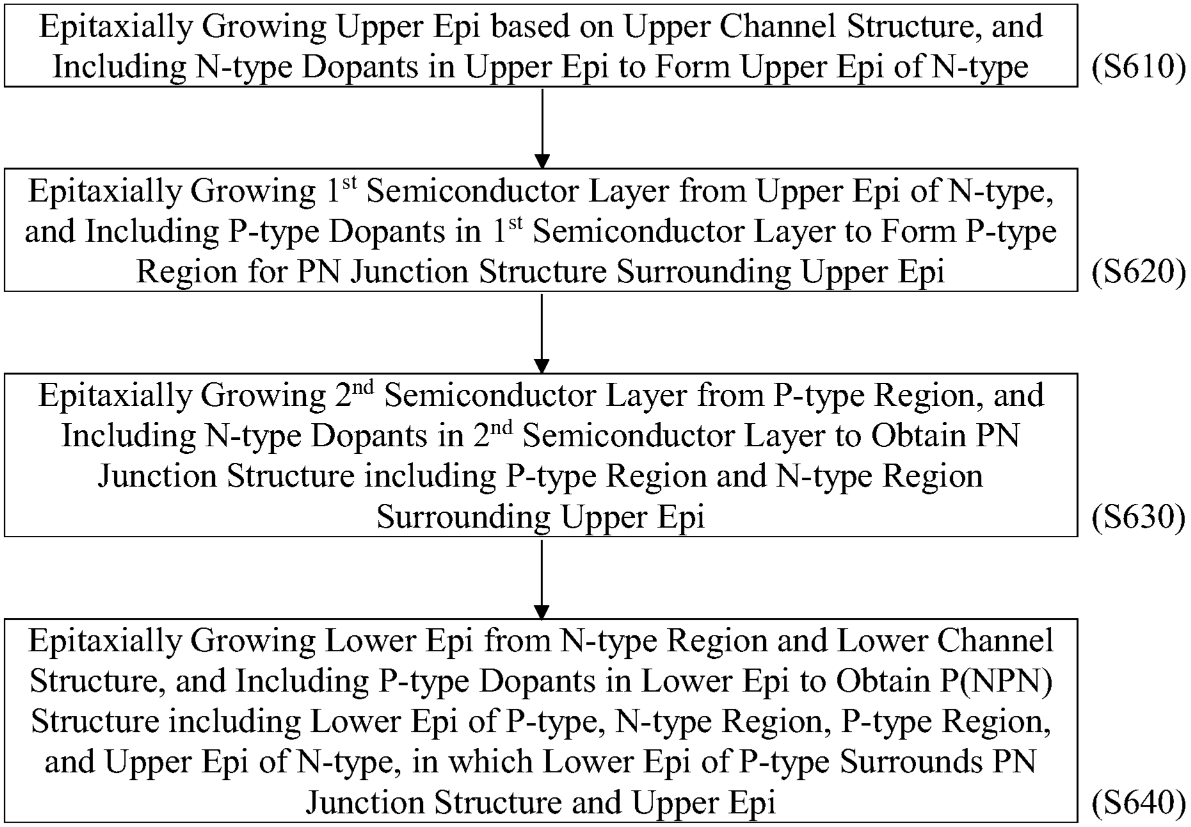
FIG. 6 illustrates a flowchart of a method of forming the P(NPN) structure shown in FIGS. 5A to 5D, according to an embodiment.

FIGS. 5A and 5B illustrate a post-simulation diagram showing formation of a P(NPN) structure based on a substrate and a channel structure in an intermediate 3DSFET structure, according to an embodiment. FIG. 5C illustrates a simplified structure of a 3DSFET device including the P(NPN) structure shown in FIGS. 5A and 5B, according to an embodiment. FIG. 6 illustrates a flowchart of a method of forming the P(NPN) structure shown in FIGS. 5A to 5D, according to an embodiment.

FIG. 5A is a perspective view, including a channel-width direction view and a channel-length direction view, of an intermediate 3DSFET structure 50' including P(NPN) structure 500A before the intermediate 3DSFET structure 50' is finished as a 3DSFET device 50 shown in FIG. 5C, and FIG. 5B is a cross-section view of the intermediate 3DSFET structure 50' in a channel-length direction vertically taken down along a line II-II' shown in FIG. 5A.

Referring to FIGS. 5A and 5B, some of the structural elements of the intermediate 3DSFET structure 50' may be the same as or similar to those of the intermediate 3DSFET structure 30' shown in FIGS. 3A and 3B. Those same or similar structural elements may include a substrate 505, an isolation layer 523, a lower channel structure 510 including a plurality of lower nanosheet channel layers 510C and lower sacrificial layers 510S, an upper channel structure 520 including a plurality of upper nanosheet channel layers 520C and upper sacrificial layers 520S, inner spacers 516, a dummy gate structure 515', and a gate spacer 550. Thus, duplicate descriptions thereof may be omitted herein as necessary, and instead, different aspects of the intermediate 3DSFET structure 50' are described herebelow.

In the present embodiment, a lower Epi 512, an upper Epi 522, and a PN junction structure 511 isolating the two Epis 512 and 512 may have different shapes or forms in the intermediate 3DSFET structure 50', compared to the corresponding structural elements in the intermediate 3DSFET structure 30' in the previous embodiment. This is because a method of forming the two Epis 512 and 522 may be different from that of forming the two Epis 312 and 322 of the intermediate 3DSFET structure 30', as will be described later.

As shown in FIGS. 5A and 5B, the upper Epi 522 of n-type may be surrounded by a $1^{st}$ semiconductor layer including, for example, Si, and the $1^{st}$ semiconductor layer may be surrounded by a $2^{nd}$ semiconductor layer also including, for example, Si, in the channel-width direction view. The $1^{st}$ semiconductor layer may further include p-type dopants, and the $2^{nd}$ semiconductor layer may further include n-type dopants. Thus, the $1^{st}$ semiconductor layer may be of p-type to form a p-type region 511+ of the PN junction structure 511, and the $2^{nd}$ semiconductor layer may be of n-type to form an n-type region 511− of the PN junction structure 511. According to an embodiment, the p-type region 511+ may entirely surround the upper Epi 522, and the n-type region 511− may entirely surround the p-type region 511+, in the channel-width direction view.

Further, the PN junction structure 511 including the p-type region 511+ and the n-type region 511− may be surrounded by the lower Epi 512 of p-type which may take an extended form the substrate 505, in the channel-width direction view. According to an embodiment, the PN junction structure 511 may be entirely surrounded by the lower Epi 512. Thus, the lower Epi 512 of p-type, the PN junction structure 511 surrounded by the lower Epi 512 of p-type, and the upper Epi 522 of n-type surrounded by the PN junction structure 511 may form a P(NPN) structure 500A at at least one side of the dummy gate structure 515'.

According to embodiments, the upper Epi 522 of n-type and the n-type region 511− may include the same or different n-type dopants, and the lower Epi 512 and the p-type region 511+ may include the same or different p-type dopants.

As the PN junction structure 511 including the p-type region 511+ and the n-type region 511− is formed in this manner between the lower Epi 512 of p-type and the upper Epi 522 of n-type, the PN junction structure 511 may enter a reverse-biased condition when a lower source/drain region formed by the lower Epi 512 and an upper source/drain region formed by the upper Epi 522 are respectively connected to the positive voltage source and the negative voltage source, thereby functioning as an electrical isolation structure preventing or minimizing current flow between the two source/drain regions 512 and 522.

In the intermediate 3DSFET structure 30' shown in FIGS. 3A and 3B, the PN junction structure 311 of the PNPN structure 300 may be formed below the upper Epi 322 to surround the lower Epi 312 except a bottom surface thereof facing the substrate 305. However, in the intermediate 3DSFET structure 50' shown in FIGS. 5A and 5B, the PN junction structure 511 of the P(NPN) structure may be formed at all sides of the upper Epi 522 including an upper side thereof to entirely surround the upper Epi 522, and the lower Epi 512 may also be formed at all sides of the PN junction structure 511 to entirely surround the PN junction structure 511, as shown in FIG. 5A. That is, the lower Epi 512 may be extended above the upper Epi 522 so that an upper portion of the lower Epi 512 may be formed above the upper Epi 522. Thus, when the intermediate 3DSFET structure 50' is finished as a 3DSFET device 50 including the P(NPN) structure 500A as shown in FIG. 5C, a lower source/drain contact plug 517 extended from a back-end-of-line (BEOL) structure (not shown) may be connected to the upper portion of a lower source/drain region 512 formed above an upper source/drain region 512 without having to be connected to a lower portion of the lower Epi 512 formed below the upper Epi 522. Here, the lower source/drain region 512 and the upper source/drain region 522 may be the same as the lower Epi 512 and the upper Epi 522, respectively, shown in FIGS. 5A and 5B, and the gate structure 515 may have replaced the dummy gate structure 515' of the intermediate 3DSFET structure 50' shown in FIGS. 5A and 5B.

FIG. 5C shows that, in the 3DSFET device 50, one side of the gate structure 515 may be formed of the P(NPN) structure 500A as described above, and the other side of the gate structure 515 may be formed of a PNPN structure 500B corresponding to the PNPN structure 200 or 300 shown in FIGS. 2 and 3A-3B, according to an embodiment.

In the embodiment shown in FIG. 5C, the PNPN structure 500B may include a lower field-effect transistor 50L including lower source/drain regions 512 of p-type and an upper field-effect transistor 50U including upper source/drain regions 522 of n-type, and further, the PN junction structure 511 interposed between the source/drain regions 512 and 522 in a reverse-biased form. Further, the lower source/drain region 512 of p-type and the upper source/drain region 522 of n-type may be respectively connected to the positive voltage source and the negative voltage source through a lower source/drain contact plug 517 and an upper source/drain contact plug 527 so that the PN junction structure 511 may electrically isolate the upper source/drain region 522 from the lower source/drain region 512. At this time, at least one of the lower source/drain region 512 and the upper source/drain region 522 of the P(NPN) structure 500A may be connected to an output node of the 3DSFET 50.

However, the disclosure may not be limited thereto. According to an embodiment, the P(NPN) structure 500A may be formed at both sides of the gate structure 515 to form a different 3DSFET device. Further, the disclosure may not limit the P(NPN) structure 500A to the use at the 3DSFET device 50 shown in FIG. 5C. Various other circuit embodiments may be implemented by the P(NPN) structure 500 in different 3DSFET devices. For example, the lower source/drain region 512 of the P(NPN) structure 500A may receive a positive voltage or may be connected to an output node of the 3DSFET device 50 through the lower source/drain contact plug 517 connected to the upper portion of the lower source/drain region 512 formed above the upper source/drain region 522.

Further, although the 3DSFET device 50 shown in FIGS. 5A-5C may include the P(NPN) structure 500A at at least one side of the gate structure 515, the 3DSFET device 50 may alternatively include an N(PNP) structure, in which an upper source/drain region of p-type is surrounded by a PN junction structure in a reverse-biased from, which is surrounded by a lower source/drain region of n-type extended upward from the substrate 505. In this case, the 3DSFET device 50 may be formed of an NFET at a lower stack, and a PFET at an upper stack, and the PN junction structure may also function as an electrical isolation structure between the n-type lower source/drain region and the p-type upper source/drain region.

Herebelow, a method of forming the P(NPN) structure 500A shown in FIGS. 5A-5C may be described in reference to FIG. 6.

In operation S610, the upper Epi 522 may be epitaxially grown based on the upper channel structure 520 including the upper nanosheet channel layers 520C. When the upper Epi 522 is grown, n-type dopants may be doped, implanted or diffused in the upper Epi 522 to form the upper Epi 522 of n-type.

According to an embodiment, when the upper Epi 522 is grown, a lower region of the intermediate 3DSFET structure 50' including a lateral side of the lower channel structure 510 in the channel-length direction view may be sealed by a protection layer such as spin-on-glass (SOG) followed by etch-back not being limited thereto so that the lower Epi 512 may not be grown along with the upper Epi 522.

In operation S620, the $1^{st}$ semiconductor layer including Si, for example, may be epitaxially grown from at least the upper Epi 522 of n-type, and p-type dopants may be doped, implanted or diffused in the $1^{st}$ semiconductor layer. Thus, the p-type region 511+ for a PN junction structure may be formed.

Here, the $1^{st}$ semiconductor layer may be outwardly grown in all directions from the upper Epi 522, and thus, an outer surface of the upper Epi 522 may be entirely surrounded by the p-type region 511+ for the PN junction structure, in the channel-width direction view as shown in FIG. 5A.

In operation S630, the $2^{nd}$ semiconductor layer including Si, for example, may be epitaxially grown from at least the p-type region 511+, and n-type dopants may be doped, implanted or diffused in the $2^{nd}$ semiconductor layer. Thus, the n-type region 511− may be formed to obtain the PN junction structure 511 including the p-type region 511+ and the n-type region 511− surrounding the upper Epi 522.

Here, the $2^{nd}$ semiconductor layer for the n-type region 511− may be grown to entirely surround the p-type region 511+ in the channel-width direction view as shown in FIG. 5A.

In operation S640, the lower Epi 512 may be epitaxially grown from the n-type region 511− in addition to the substrate 505 and the upper channel structure 510 including the lower nanosheet channel layers 510C. When the lower Epi 512 is grown, p-type dopants may be doped, implanted or diffused in the lower Epi 512 to obtain the P(NPN) structure 300.

According to an embodiment, prior to the lower Epi 512 is grown, the sealed lower region of the intermediate 3DSFET structure 50' may be opened by removing the protection layer through, for example, dry and/or wet etching.

Thus, the lower Epi 512 may be grown on the substrate 505 and the lower channel structure 510, and may further be grown to entirely surround the n-type region 511− of the PN junction structure 511 in the channel-width direction view. Thus, in the cross-section view of the intermediate 3DSFET structure 50' shown in FIGS. 5A and 5B, the PN junction structure 511 is not only interposed between the lower Epi 512 and the upper Epi 522 but also formed above the upper Epi 522 with the upper portion of the lower Epi 512 thereabove.

Although not shown in the drawings for brevity purposes, additional structural elements may be added to the intermediate 3DSFET structure 50' through patterning, etching and/or deposition processes to complete the intermediate 3DSFET structure 50' as the 3DSFET device 50. For example, the dummy gate structure 515' and the sacrificial layers 510S and 520S may be replaced by a replacement gate structure corresponding to the gate structure 515, and a plurality of contact plugs may be formed on the intermediate 3DSFET structure 50' to obtain the 3DSFET device 50 shown in FIG. 5C.

In the above embodiments described in reference to FIGS. 3A-3B to FIGS. 5A-5C, each of the lower channel structure and the upper channel structure is described as including a plurality of nanosheet channel layers to form a corresponding field-effect transistor as a nanosheet transistor. However, the disclosure is not limited thereto. The disclosure may also apply to an 3DSFET device in which each of the lower channel structure and the upper channel structure includes one or more fin structures to form a corresponding field-effect transistor as a FinFET, according to an embodiment. Further, the disclosure may apply to a hybrid 3DSFET device in which one of the lower channel structure and the upper channel structure includes a plurality of nanosheet channel layers while the other includes one or more fin structures to form the 3DSFET device as a combination of a nanosheet transistor and a FinFET at different stacks, according to an embodiment.

Figure 7:
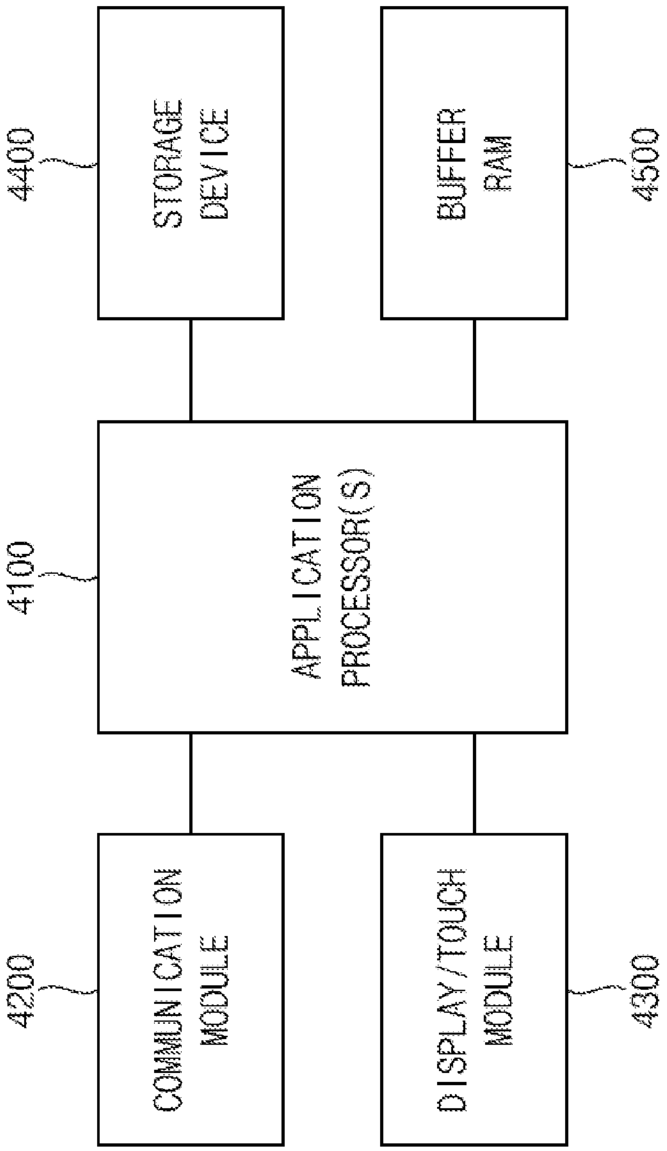
FIG. 7 is a schematic block diagram illustrating an electronic device including at least one 3DSFET device including a PN junction structure as an isolation structure between a lower source/drain region and an upper source/drain region, according to an embodiment.

FIG. 7 is a schematic block diagram illustrating an electronic device including at least one 3DSFET device including a PN junction structure as an isolation structure between a lower source/drain region and an upper source/drain region, according to an embodiment.

Referring to FIG. 7, an electronic device 4000 may include at least one application processor 4100, a communication module 4200, a display/touch module 4300, a storage device 4400, and a buffer RAM 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMNIC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the electronic device 4000 may include at least one of the 3DSFET devices 20, 30 and 50 described above in reference to FIGS. 2 to 6.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A three-dimensionally stacked field-effect transistor (3DSFET) device comprising:

a $1^{st}$ lower source/drain region of a $1^{st}$ polarity type connected to a lower channel structure;

a $1^{st}$ upper source/drain region of a $2^{nd}$ polarity type, connected to an upper channel structure, above the $1^{st}$ lower source/drain region;

a $1^{st}$ PN junction structure, between the $1^{st}$ lower source/drain region and the $1^{st}$ upper source/drain region, configured to electrically isolate the $1^{st}$ upper source/drain region from the $1^{st}$ lower source/drain region;

a $2^{nd}$ lower source/drain region of the $1^{st}$ polarity type connected to the $1^{st}$ lower source/drain region through the lower channel structure;

a $2^{nd}$ upper source/drain region of the $2^{nd}$ polarity type connected to the $1^{st}$ upper source/drain region through the upper channel structure; and a $2^{nd}$ PN junction structure, between the $2^{nd}$ lower source/drain region and the $2^{nd}$ upper source/drain region, configured to electrically isolate the $2^{nd}$ upper source/drain region from the $2^{nd}$ lower source/drain region, wherein the $1^{st}$ PN junction structure comprises a $1^{st}$ region of the $1^{st}$ polarity type and a $2^{nd}$ region of the $2^{nd}$ polarity type, wherein the $2^{nd}$ PN junction structure comprises a $3^{rd}$ region of the $1^{st}$ polarity type and a $4^{th}$ region of the $2^{nd}$ polarity type, wherein the $2^{nd}$ region of the $1^{st}$ PN junction structure is on a first surface of the $1^{st}$ lower source/drain region, and wherein the $1^{st}$ region above the $2^{nd}$ region of the $1^{st}$ PN junction structure is on a second surface of the $1^{st}$ upper source/drain region.

2. The 3DSFET device of claim 1, wherein the $2^{nd}$ region of the $1^{st}$ PN junction structure surrounds the $1^{st}$ lower source/drain region except a second surface thereof, wherein the $1^{st}$ region is above the $2^{nd}$ region of the $1^{st}$ PN junction structure, and wherein the $1^{st}$ upper source/drain region surrounds the $1^{st}$ region of the $1^{st}$ PN junction structure, and is not on the second surface of the $1^{st}$ lower source/drain region.

3. The 3DSFET device of claim 1, wherein a portion of the $1^{st}$ region of the $1^{st}$ PN junction structure is on a first surface of the $1^{st}$ upper source/drain region, and wherein a portion of the $2^{nd}$ region is above the portion of the $1^{st}$ region of the $1^{st}$ PN junction structure.

4. The 3DSFET of claim 3, wherein the $1^{st}$ upper source/drain region is surrounded by the $1^{st}$ region of the $1^{st}$ PN junction structure, which is surrounded by the $2^{nd}$ region of the $1^{st}$ PN junction structure.

5. The 3DSFET of claim 3, wherein a portion of the $1^{st}$ lower source/drain region is above the portion of the $2^{nd}$ region of the $1^{st}$ PN junction structure.

6. The 3DSFET of claim 5, wherein the $1^{st}$ upper source/drain region is surrounded by the $1^{st}$ region of the $1^{st}$ PN junction structure, which is surrounded by the $2^{nd}$ region of the $1^{st}$ PN junction structure, and wherein the $1^{st}$ lower source/drain region surrounds the $2^{nd}$ region of the $1^{st}$ PN junction structure.

7. The 3DSFET device of claim 5, further comprising:

a lower source/drain contact plug connected to the portion of the $1^{st}$ lower source/drain region above the portion of the $2^{nd}$ region of the $1^{st}$ PN junction structure.

8. The 3DSFET device of claim 1, wherein the $2^{nd}$ region of the $1^{st}$ PN junction structure surrounds the $1^{st}$ lower source/drain region except a second surface thereof, wherein the $1^{st}$ region is above the $2^{nd}$ region of the $1^{st}$ PN junction structure, wherein the $1^{st}$ upper source/drain region surrounds the $1^{st}$ region of the $1^{st}$ PN junction structure, and is not on the second surface of the $1^{st}$ lower source/drain region, wherein the $4^{th}$ region of the $2^{nd}$ PN junction structure is on a first surface of the $2^{nd}$ lower source/drain region, wherein the $3^{rd}$ region above the $4^{th}$ region of the $2^{nd}$ PN junction structure is on a second surface of the $2^{nd}$ upper source/drain region, wherein the $4^{th}$ region of the $2^{nd}$ PN junction structure surrounds the $2^{nd}$ lower source/drain region except a second surface thereof, wherein the $3^{rd}$ region is above the $4^{th}$ region of the $2^{nd}$ PN junction structure, wherein the $2^{nd}$ upper source/drain region surrounds the $3^{rd}$ region of the $2^{nd}$ PN junction structure, and is not on the second surface of the $2^{nd}$ lower source/drain region.

9. The 3DSFET device of claim 1, wherein the $2^{nd}$ region of the $1^{st}$ PN junction structure surrounds the $1^{st}$ lower source/drain region except a second surface thereof, wherein the $1^{st}$ region is above the $2^{nd}$ region of the $1^{st}$ PN junction structure, wherein the $1^{st}$ upper source/drain region surrounds the $1^{st}$ region of the $1^{st}$ PN junction structure, and is not on the second surface of the $1^{st}$ lower source/drain region, wherein a portion of the $3^{rd}$ region of the $2^{nd}$ PN junction structure is on a first surface of the $2^{nd}$ upper source/drain region, wherein a portion of the $4^{th}$ region is above the portion of the $3^{rd}$ region of the $2^{nd}$ PN junction structure, and wherein a portion of the $2^{nd}$ lower source/drain region is above the portion of the $4^{th}$ region of the $2^{nd}$ PN junction structure.

10. The 3DSFET device of claim 1, further comprising:

a lower source/drain contact plug connected to the $1^{st}$ lower source/drain region, and configured to provide a voltage having a same polarity type as the $1^{st}$ lower source/drain region.

11. The 3DSFET device of claim 1, further comprising:

an upper source/drain contact plug connected to the $1^{st}$ upper source/drain region and providing a voltage having a same polarity type as the $1^{st}$ upper source/drain region.

12. The 3DSFET device of claim 1, wherein a portion of the $1^{st}$ region of the $1^{st}$ PN junction structure is on a first surface of the $1^{st}$ upper source/drain region, wherein a portion of the $2^{nd}$ region is above the portion of the $1^{st}$ region of the $1^{st}$ PN junction structure, and wherein a portion of the $1^{st}$ lower source/drain region is above the portion of the $2^{nd}$ region of the $1^{st}$ PN junction structure, wherein a portion of the $3^{rd}$ region of the $2^{nd}$ PN junction structure is on a first surface of the $2^{nd}$ upper source/drain region, wherein a portion of the $4^{th}$ region is above the portion of the $3^{rd}$ region of the $2^{nd}$ PN junction structure, and wherein a portion of the $2^{nd}$ lower source/drain region is above the portion of the $4^{th}$ region of the $2^{nd}$ PN junction structure.

13. A three-dimensionally stacked field-effect transistor (3DSFET) device comprising:

a $1^{st}$ lower source/drain region of a $1^{st}$ polarity type connected to a lower channel structure;

a $1^{st}$ upper source/drain region of a $2^{nd}$ polarity type, connected to an upper channel structure, above the $1^{st}$ lower source/drain region;

a $1^{st}$ PN junction structure, between the $1^{st}$ lower source/drain region and the $1^{st}$ upper source/drain region, configured to electrically isolate the $1^{st}$ upper source/drain region from the $1^{st}$ lower source/drain region;

a $2^{nd}$ lower source/drain region of the $1^{st}$ polarity type connected to the $1^{st}$ lower source/drain region through the lower channel structure;

a $2^{nd}$ upper source/drain region of the $2^{nd}$ polarity type connected to the $1^{st}$ upper source/drain region through the upper channel structure;

a $2^{nd}$ PN junction structure, between the $2^{nd}$ lower source/drain region and the $2^{nd}$ upper source/drain region, configured to electrically isolate the $2^{nd}$ upper source/drain region from the $2^{nd}$ lower source/drain region; and a lower source/drain contact plug connected to the $1^{st}$ lower source/drain region, and configured to provide a voltage having a same polarity type as the $1^{st}$ lower source/drain region, wherein the $1^{st}$ PN junction structure comprises a $1^{st}$ region of the $1^{st}$ polarity type and a $2^{nd}$ region of the $2^{nd}$ polarity type, and wherein the $2^{nd}$ PN junction structure comprises a $3^{rd}$ region of the $1^{st}$ polarity type and a $4^{th}$ region of the $2^{nd}$ polarity type.

14. The 3DSFET device of claim 13, further comprising:

an upper source/drain contact plug connected to the $1^{st}$ upper source/drain region and providing a voltage having a same polarity type as the $1^{st}$ upper source/drain region.

15. The 3DSFET device of claim 13, wherein the $2^{nd}$ region of the $1^{st}$ PN junction structure is on a first surface of the $1^{st}$ lower source/drain region, and wherein the $1^{st}$ region above the $2^{nd}$ region of the $1^{st}$ PN junction structure is on a second surface of the $1^{st}$ upper source/drain region.

16. A three-dimensionally stacked field-effect transistor (3DSFET) device comprising:

a $1^{st}$ lower source/drain region of a $1^{st}$ polarity type connected to a lower channel structure;

a $1^{st}$ upper source/drain region of a $2^{nd}$ polarity type, connected to an upper channel structure, above the $1^{st}$ lower source/drain region;

a $1^{st}$ PN junction structure, between the $1^{st}$ lower source/drain region and the $1^{st}$ upper source/drain region, configured to electrically isolate the $1^{st}$ upper source/drain region from the $1^{st}$ lower source/drain region;

a $2^{nd}$ lower source/drain region of the $1^{st}$ polarity type connected to the $1^{st}$ lower source/drain region through the lower channel structure;

a $2^{nd}$ upper source/drain region of the $2^{nd}$ polarity type connected to the $1^{st}$ upper source/drain region through the upper channel structure; and a $2^{nd}$ PN junction structure, between the $2^{nd}$ lower source/drain region and the $2^{nd}$ upper source/drain region, configured to electrically isolate the $2^{nd}$ upper source/drain region from the $2^{nd}$ lower source/drain region, wherein the $1^{st}$ PN junction structure comprises a $1^{st}$ region of the $1^{st}$ polarity type and a $2^{nd}$ region of the $2^{nd}$ polarity type, wherein the $2^{nd}$ PN junction structure comprises a $3^{rd}$ region of the $1^{st}$ polarity type and a $4^{th}$ region of the $2^{nd}$ polarity type, wherein a portion of the $1^{st}$ region of the $1^{st}$ PN junction structure is on a top first surface of the $1^{st}$ upper source/drain region, wherein a portion of the $2^{nd}$ region is above the portion of the $1^{st}$ region of the $1^{st}$ PN junction structure, and wherein a portion of the $1^{st}$ lower source/drain region is above the portion of the $2^{nd}$ region of the $1^{st}$ PN junction structure, wherein a portion of the $3^{rd}$ region of the $2^{nd}$ PN junction structure is on a first surface of the $2^{nd}$ upper source/drain region, wherein a portion of the $4^{th}$ region is above the portion of the $3^{rd}$ region of the $2^{nd}$ PN junction structure, and wherein a portion of the $2^{nd}$ lower source/drain region is above the portion of the $4^{th}$ region of the $2^{nd}$ PN junction structure.

17. The 3DSFET device of claim 16, wherein the $2^{nd}$ region of the $1^{st}$ PN junction structure is on a first surface of the $1^{st}$ lower source/drain region, and wherein the $1^{st}$ region above the $2^{nd}$ region of the $1^{st}$ PN junction structure is on a second surface of the $1^{st}$ upper source/drain region.

18. The 3DSFET device of claim 16, wherein the $1^{st}$ upper source/drain region is surrounded by the $1^{st}$ region of the $1^{st}$ PN junction structure, which is surrounded by the $2^{nd}$ region of the $1^{st}$ PN junction structure.

19. The 3DSFET device of claim 16, wherein the $1^{st}$ upper source/drain region is surrounded by the $1^{st}$ region of the $1^{st}$ PN junction structure, which is surrounded by the $2^{nd}$ region of the $1^{st}$ PN junction structure, and wherein the $1^{st}$ lower source/drain region surrounds the $2^{nd}$ region of the $1^{st}$ PN junction structure.

20. The 3DSFET device of claim 16, further comprising:

a lower source/drain contact plug connected to the $1^{st}$ lower source/drain region, and configured to provide a voltage having a same polarity type as the $1^{st}$ lower source/drain region; and an upper source/drain contact plug connected to the $1^{st}$ upper source/drain region and providing a voltage having a same polarity type as the $1^{st}$ upper source/drain region.

* * * * *